US009903896B2

(12) United States Patent
Wang et al.

(10) Patent No.: US 9,903,896 B2
(45) Date of Patent: Feb. 27, 2018

(54) METHOD FOR TESTING DYNAMIC MODEL PARAMETERS OF WIND POWER PLANT

(71) Applicants: GANSU ELECTRIC POWER CORPORATION WIND POWER TECHNOLOGY CENTER, Lanzhou, Gansu Province (CN); STATE GRID GANSU ELETRIC POWER CORPORATION, Lanzhou, Gansu Province (CN); STATE GRID CORPORATION OF CHINA, Beijing (CN)

(72) Inventors: Ningbo Wang, Lanzhou (CN); Liang Lu, Lanzhou (CN); Duo Wang, Lanzhou (CN); Shiyuan Zhou, Lanzhou (CN); Yuhong Zhang, Lanzhou (CN); Kun Ding, Lanzhou (CN); Dan Jin, Lanzhou (CN); Long Zhao, Lanzhou (CN); Shien He, Lanzhou (CN); Xushan Han, Lanzhou (CN); Yanhong Ma, Lanzhou (CN); Qiang Zhou, Lanzhou (CN); Dingmei Wang, Lanzhou (CN); Hongquan Xu, Lanzhou (CN); Guangtu Liu, Lanzhou (CN); Xiaoyong Wang, Lanzhou (CN); Jin Li, Lanzhou (CN); Ming Ma, Lanzhou (CN); Jinping Zhang, Lanzhou (CN); Rong Huang, Lanzhou (CN); Qingquan Lv, Lanzhou (CN); Jianmei Zhang, Lanzhou (CN)

(73) Assignees: GANSU ELECTRIC POWER CORPORATION WIND POWER TECHNOLOGY CENTER, Gansu Province (CN); STATE GRID GANSU ELECTRIC POWER CORPORATION, Gansu Province (CN); STATE GRID CORPORATION OF CHINA, Beijing (CN)

(*) Notice: Subject to any disclaimer, the term of this patent is extended or adjusted under 35 U.S.C. 154(b) by 247 days.

(21) Appl. No.: 14/905,279

(22) PCT Filed: Apr. 2, 2014

(86) PCT No.: PCT/CN2014/000363
§ 371 (c)(1),
(2) Date: Jan. 14, 2016

(87) PCT Pub. No.: WO2015/007070
PCT Pub. Date: Jan. 22, 2015

(65) Prior Publication Data
US 2016/0161538 A1 Jun. 9, 2016

(30) Foreign Application Priority Data

Jul. 16, 2013 (CN) .......................... 2013 1 0297778

(51) Int. Cl.
*G01R 13/04* (2006.01)
*G01R 21/133* (2006.01)
(Continued)

(52) U.S. Cl.
CPC ....... *G01R 21/1331* (2013.01); *G01R 21/003* (2013.01); *G06F 11/26* (2013.01); *G06F 17/5009* (2013.01)

(58) Field of Classification Search
CPC . G01R 21/1331; G01R 21/03; G06F 17/5009; G06F 11/26
See application file for complete search history.

(56) References Cited

U.S. PATENT DOCUMENTS

2007/0253818 A1* 11/2007 Stommel ............... F03D 1/0675
416/132 B
2009/0230681 A1* 9/2009 Scholte-Wassink .. F03D 7/0296
290/44

(Continued)

FOREIGN PATENT DOCUMENTS

CN 101764413 A 6/2010
CN 101937483 A 1/2011
(Continued)

*Primary Examiner* — Tung X Nguyen
*Assistant Examiner* — Dominic Hawkins
(74) *Attorney, Agent, or Firm* — Jiwen Chen

(57) ABSTRACT

The present invention discloses a testing method for dynamic model parameters of a wind power plant, wherein under testing conditions including stable running of wind turbine generators and reactive-load compensation equipment, stable wind speed between a cut-in wind speed and a rated wind speed, and the wind power plant output smaller
(Continued)

than a rated output, finishes a wind speed transient disturbance test, a wind power plant unit tripping and inputting disturbance test, a wind power plant power change test, a disturbance test for reactive-load compensation equipment of the wind power plant, a tripping disturbance test for hydroelectric power plant and thermal power plant near the wind power plant and a manual single-phase ground short circuit test at the outgoing line part of the wind power plant, and records running curves of the wind power plant under each condition to finish the parameter test. The present invention realizes the advantage of providing precise measurement data for the stability analysis of an electric power system and the production dispatching of a power grid.

1 Claim, 1 Drawing Sheet

(51) Int. Cl.
*G06F 17/50* (2006.01)
*G06F 11/26* (2006.01)
*G01R 21/00* (2006.01)

(56) References Cited

U.S. PATENT DOCUMENTS

| | | | |
|---|---|---|---|
| 2012/0146333 A1* | 6/2012 | Bywaters | F03D 7/0248 290/44 |
| 2013/0103327 A1* | 4/2013 | Wu | F03D 17/00 702/58 |
| 2013/0332220 A1* | 12/2013 | Nielsen | G06Q 10/20 705/7.21 |

FOREIGN PATENT DOCUMENTS

| | | |
|---|---|---|
| CN | 102751737 A | 10/2012 |
| CN | 103366064 A | 10/2013 |
| KR | 20080028605 A | 4/2008 |
| KR | 20090055061 A | 6/2009 |

* cited by examiner

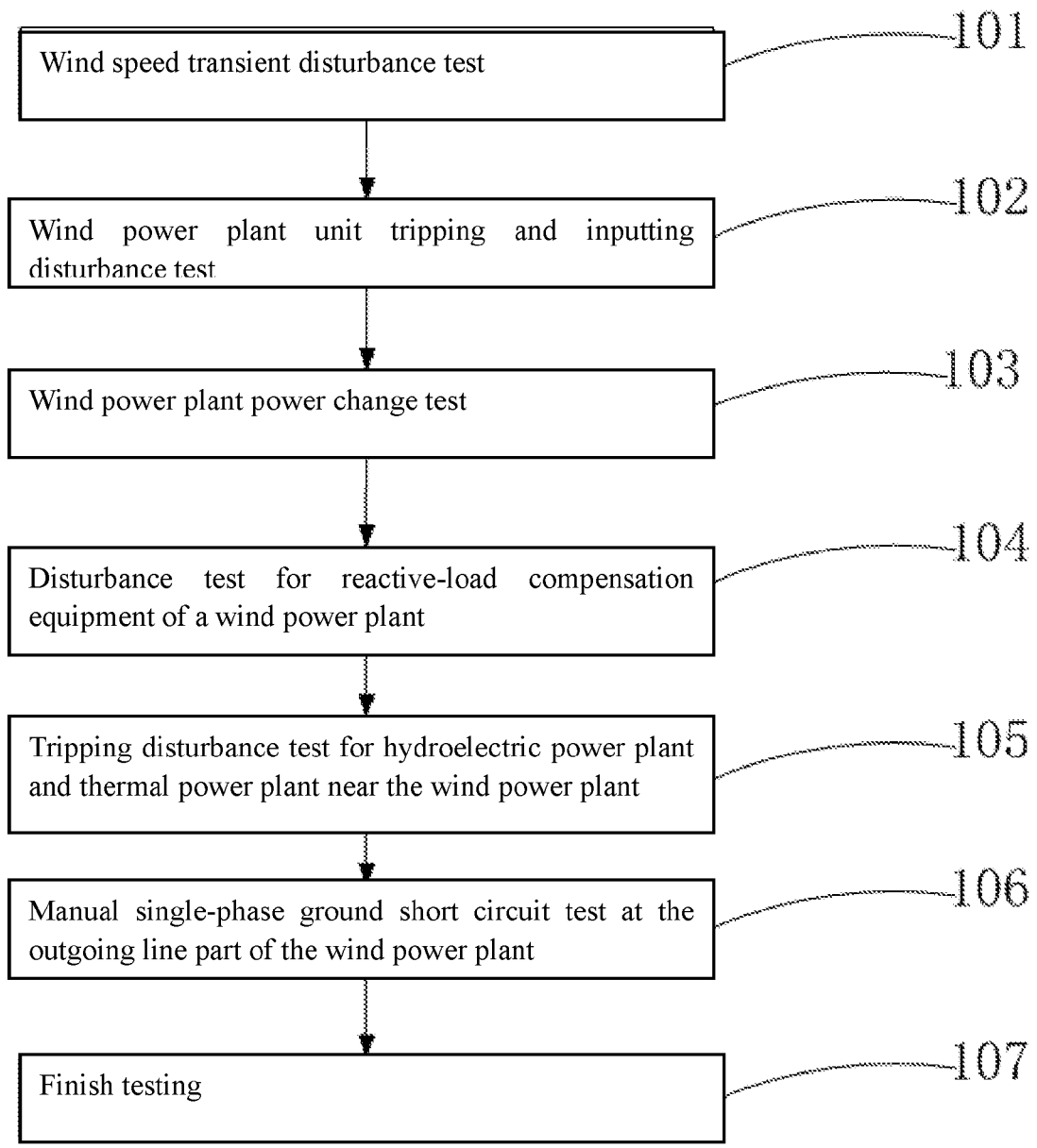

METHOD FOR TESTING DYNAMIC MODEL PARAMETERS OF WIND POWER PLANT

This is a U.S. national stage application of PCT Application No. PCT/CN2014/000363 under 35 U.S.C. 371, filed Apr. 2, 2014 in Chinese, claiming the priority benefit of Chinese Application No. 201310297778.9, filed Jul. 16, 2013, which is hereby incorporated by reference.

TECHNICAL FIELD

The present invention is related to the field of electricity generation of a wind power plant, specifically a testing method for dynamic model parameters of a wind power plant.

BACKGROUND TECHNOLOGY

Most of the large wind power bases constructed after the wind power of China enters a scale development stage are located at three north areas (northwest, northeast and north China), and generally, the large wind power bases are far away from a load center, and the electric power needs to be conveyed to the load center for utilization through long distance and high voltage. The wind power output of the large wind power bases would fluctuate in a great range along with wind resource due to the intermittence, randomness and fluctuation of the wind resource, further leading to the fluctuation of the charging power of a transmission network and bringing a series of problems to the running safety of a power grid.

Therefore, it is necessary to build models for wind turbine generators and a wind power plant and test model parameters to provide a precise calculation basis for the stability analysis of an electric power system and the production dispatching of the power grid and provide basic data for the development of grid access or new operation control technology for the wind turbine generators and wind power plant. However, there is no testing method capable of precisely providing measured data for dynamic model parameters of the wind power plants.

SUMMARY OF THE INVENTION

The present invention is aimed to provide a testing method for dynamic model parameters of a wind power plant according to said problems to realize the advantage of providing precise measured data for the stability analysis of an electric power system and the production dispatching of a power grid.

In order to achieve said purpose, the present invention proposes a technical solution, i.e. a testing method for dynamic model parameters of the wind power plant comprising the following steps:

Testing conditions include stable running of wind turbine generators and reactive-load compensation equipment, stable wind speed between a cut-in wind speed and a rated wind speed, and the wind power plant output smaller than a rated output;

Step 1, under the stable grid access running condition of the wind power plant, recording running curves of the wind power plant, more specifically, recording the curves of the situation changes of the active power and reactive power of the wind power plant, the active power and reactive power of each feeder line, the output voltage and current of wind turbine generators, the voltage and current of the alternating current side and direct current side of a transducer, and the pitch angles of the wind turbine generators;

Step 2, under the stable grid access running condition of the wind power plant, removing all the wind turbine generators on one feeder line, communicating all the wind turbine generators on said feeder line after the power of the wind power plant stabilizes, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 3, under the stable grid access running condition of the wind power plant, inputting a wind power plant monitoring system to a power closed loop, firstly, carrying out a given active power signal step on the monitoring system, more specifically, performing a lower step test for a given power value, then performing an upper step test for the given power value after the power of the wind power plant stabilizes; secondly, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 4, under the stable grid access running condition of the wind power plant, disturbing the reactive-load compensation equipment in the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 5, under the stable grid access running condition of the wind power plant, switching the wind turbine generators to hydroelectric generating units or thermal power generating units near the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 6, under the stable grid access running condition of the wind power plant, carrying out single-phase ground short circuit on a lead at the output end of the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 7, comparing the running curves of the wind power plant recorded in step 1 with that in step 6 to finish the test for the dynamic model parameters of the wind power plant.

The technical solution of the present invention has the following beneficial effect:

Under special conditions, the running curves of the wind power plant under different parameter changes are recorded through simulating each parameter in the dynamic model of the wind power plant so as to provide precise measurement data for the stability analysis of the electric power system and the production dispatching of the power grid.

The technical solution of the present invention will be further described in detail by means of embodiments with reference to the attached drawings.

BRIEF DESCRIPTION OF THE DRAWINGS

FIG. 1 is the flow chart of a testing method for dynamic model parameters of a wind power plant according to an embodiment of the present invention.

DETAILED EMBODIMENTS OF THE INVENTION

A preferred embodiment of the present invention will be described below with reference to the attached drawing, it should be understood that the preferred embodiment is only used for explaining the present invention but not used for limiting the present invention.

As shown in FIG. 1, a testing method for dynamic model parameters of a wind power plant comprises the following steps:

Testing conditions include stable running of wind turbine generators and reactive-load compensation equipment, stable wind speed between a cut-in wind speed and a rated wind speed, and the wind power plant output smaller than a rated output;

Step 101, under the stable grid access running condition of the wind power plant, recording running curves of the wind power plant, more specifically, recording the curves of the situation changes of the active power and reactive power of the wind power plant, the active power and reactive power of each feeder line, the output voltage and current of wind turbine generators, the voltage and current of the alternating current side and direct current side of a transducer, and the pitch angles of the wind turbine generators;

Step 102, under the stable grid access running condition of the wind power plant, removing all the wind turbine generators on one feeder line, communicating all the wind turbine generators on said feeder line after the power of the wind power plant stabilizes, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 103, under the stable grid access running condition of the wind power plant, inputting a wind power plant monitoring system to a power closed loop, firstly, carrying out a given active power signal step on the monitoring system, more specifically, performing a lower step test for a given power value, then performing an upper step test for the given power value after the power of the wind power plant stabilize; secondly, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 104, under the stable grid access running condition of the wind power plant, disturbing the reactive-load compensation equipment in the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 105, under the stable grid access running condition of the wind power plant, switching the wind turbine generators to hydroelectric generating units or thermal power generating units near the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 106, under the stable grid access running condition of the wind power plant, carrying out single-phase ground short circuit on a lead at the output end of the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

Step 107, comparing the running condition curves of the wind power plant recorded in the step 1 with that in the step 6 to finish the test for the dynamic model parameters of the wind power plant.

The specific wiring of the wind power plant is as follows:

Accessing the voltage and current of the high voltage side and low voltage side of a main transformer to a main transformer room of the wind power plant; accessing the voltage and current of each feeder line to a feeder line room of the wind power plant; selecting at least one wind turbine generator from the wind power plant, and accessing the voltage, current and pitch angles of generator terminals and the voltage and current of the alternating/direct current side of the transducer.

In the step 104, disturbing operations such as inputting/tripping, voltage/given reactive value step, given power factor value step etc. are applied to reactive-load compensation equipment in the wind power plant, for instance SVC, SVG, capacitor bank and the like.

Finally, what shall be explained is that the above-mentioned is only the preferred embodiment of the present invention but not used for limiting the present invention, although said embodiment explains the present invention in detail, those skilled in this field still can modify the technical solution in aforesaid embodiment or equivalently replace some technical characteristics. Any modification, equivalent replacement, improvements and the like in the spirit and principle of the present invention should be included in the scope of the present invention.

The invention claimed is:

1. A testing method for dynamic model parameters of a wind power plant is characterized by comprising the following steps:

testing conditions include stable running of wind turbine generators and reactive-load compensation equipment, stable wind speed between a cut-in wind speed and a rated wind speed, and the wind power plant output smaller than a rated output;

step 1, under the stable grid access running condition of the wind power plant, recording running curves of the wind power plant, more specifically, recording the curves of the situation changes of the active power and reactive power of the wind power plant, the active power and reactive power of each feeder line, the output voltage and current of wind turbine generators, the voltage and current of the alternating current side and direct current side of a transducer, and the pitch angles of the wind turbine generators;

step 2, under the stable grid access running condition of the wind power plant, removing all the wind turbine generators on one feeder line, communicating all the wind turbine generators on said feeder line after the power of the wind power plant stabilizes, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

step 3, under the stable grid access running condition of the wind power plant, inputting a wind power plant monitoring system to a power closed loop, firstly, carrying out a given active power signal step on the monitoring system, more specifically, performing a lower step test for a given power value, then performing an upper step test for the given power value after the power of the wind power plant stabilizes; secondly, recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

step 4, under the stable grid access running condition of the wind power plant, disturbing the reactive-load compensation equipment in the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

step 5, under the stable grid access running condition of the wind power plant, switching the wind turbine generators to hydroelectric generating units or thermal power generating units near the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

step 6, under the stable grid access running condition of the wind power plant, carrying out single-phase ground short circuit on a lead at the output end of the wind power plant, and then recording the running curves of the wind power plant, more specifically, recording the curves of the situation changes of the active power and reactive power of the wind power plant, the active power and reactive power of each feeder line, the output voltage and current of the wind turbine generators, the voltage and current of the alternating current side and direct current side of the transducer, and the pitch angles of the wind turbine generators;

step 7, comparing the running curves of the wind power plant recorded in the step 1 with that in the step 6 to finish the test for the dynamic model parameters of the wind power plant.

* * * * *